(12) United States Patent
Eifuku et al.

(10) Patent No.: US 9,949,380 B2
(45) Date of Patent: Apr. 17, 2018

(54) MANUFACTURING METHOD OF ELECTRONIC COMPONENT, ELECTRONIC COMPONENT, AND MANUFACTURING APPARATUS OF ELECTRONIC COMPONENT

(71) Applicant: Panasonic Intellectual Property Management Co., Ltd., Osaka (JP)

(72) Inventors: Hideki Eifuku, Osaka (JP); Wanyu Tie, Hyogo (JP); Hironori Munakata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/993,753

(22) Filed: Jan. 12, 2016

(65) Prior Publication Data

US 2016/0255716 A1 Sep. 1, 2016

(30) Foreign Application Priority Data

Feb. 27, 2015 (JP) .................................. 2015-038455
Feb. 27, 2015 (JP) .................................. 2015-038456

(51) Int. Cl.
*H05K 3/36* (2006.01)
*H05K 3/32* (2006.01)

(52) U.S. Cl.
CPC ............. *H05K 3/361* (2013.01); *H05K 3/323* (2013.01); *H05K 2203/0278* (2013.01)

(58) Field of Classification Search
CPC ......... H05K 3/323; H05K 3/361; B32B 37/26
See application file for complete search history.

(56) References Cited

U.S. PATENT DOCUMENTS

| 2003/0049425 A1* | 3/2003 | Ono ...................... H01L 21/563 428/217 |
| 2010/0181667 A1* | 7/2010 | Iwase ........................ B30B 5/02 257/737 |

FOREIGN PATENT DOCUMENTS

| JP | 08-116145 A | 5/1996 |
| JP | 2009-157186 A | 7/2009 |
| JP | 2010225845 A | * 10/2010 |
| JP | 2014-220363 A | 11/2014 |

OTHER PUBLICATIONS

Machine Translation of JP 2010225845 A.*

* cited by examiner

*Primary Examiner* — Christopher T Schatz
(74) *Attorney, Agent, or Firm* — Pearne & Gordon LLP (57) ABSTRACT

A manufacturing method of an electronic component including a circuit component provided with plural first electrodes in an end, and a substrate provided with plural second electrodes includes: pressing a part of a second surface of an inside of a second edge of the circuit component in the end to the substrate by a press attaching surface of the press attaching tool with an adhesive arranged between the circuit component and the substrate; making a part of the adhesive reach the second surface to cover at least a part of the second edge by the pressing; and curing the adhesive between the end and the substrate and the part of the adhesive covering the at least the part of the second edge.

7 Claims, 8 Drawing Sheets

MANUFACTURING METHOD OF ELECTRONIC COMPONENT, ELECTRONIC COMPONENT, AND MANUFACTURING APPARATUS OF ELECTRONIC COMPONENT

CROSS-REFERENCES TO RELATED APPLICATION(S)

This application is based on and claims priority from Japanese Patent Applications No. 2015-038455 and No. 2015-038456 both filed on Feb. 27, 2015, the entire contents of which are incorporated herein by reference.

BACKGROUND

1. Field of the Invention

One or more embodiments of the present invention relate to a manufacturing method of an electronic component configured by connecting a circuit component such as a flexible wiring substrate to a substrate, this electronic component, and a manufacturing apparatus of the electronic component.

2. Description of Related Art

An electronic component configured by connecting a circuit component such as a flexible wiring substrate to a substrate is used as a component of an electronic device such as a portable terminal. A method for connecting the circuit component to the substrate includes, for example, a method (see Patent Reference 1, for instance) for soldering mutual connection leads respectively formed in a rigid substrate and a flexible substrate as the circuit component, or a method (see Patent References 2, 3, for instance) for bonding the circuit component to the substrate using an adhesive such as a thermosetting resin. In the case of handling of the electronic component with such a configuration, for example, work of incorporation into the electronic device, an external force acts on a connection between the circuit component and the substrate, and trouble of poor connection tends to occur. Particularly, in the case of involving work of an operation form of twisting the circuit component, the external force is concentrated at the end of the connection, with the result that a serious defect in which the electronic component itself is disabled, for example, peeling from the end of the connection may occur.

In order to prevent the occurrence of such a defect in a product, various measures to reinforce the connection between the circuit component and the substrate are taken conventionally. For example, a related art illustrated in Patent Reference 1 is constructed so as to provide the vicinity of both sides pinching a solder connection with a fastening part for fastening the flexible substrate to the rigid substrate with the fastening part extending through the substrates in a thickness direction. Also, another related art illustrated in Patent Reference 2 is constructed so that an anisotropic conductive material is projected to an upper surface through a hole bored in a flexible substrate as the circuit component and this anisotropic conductive material is cured in a rivet head shape to thereby form a connection reinforced structure. Further, a still another related art illustrated in Patent Reference 3 is constructed so as to improve a joining effect by setting a region of application of anisotropic conductive paste so that the anisotropic conductive paste surrounds the edge of a flexible substrate from the periphery in a mounting region in which the flexible substrate as the circuit component overlaps with a printed wiring substrate.

Patent Reference 1 is JP-A-8-116145, Patent Reference 2 is JP-A-2009-157186, and Patent Reference 3 is JP-A-2014-220363.

SUMMARY

However, the related arts including the related arts illustrated in the examples of Patent References described above have the following drawbacks in the case of surely ensuring a peeling strength between the circuit component and the substrate by a simple method. First, the related art illustrated in Patent Reference 1 requires work of a different process of boring a hole in the flexible substrate as the circuit component and inserting a fastener and forming the fastening part. Also, the related art illustrated in Patent Reference 2 requires work of a different process of similarly boring the hole in the flexible substrate and forming the rivet head, and in both of the examples, the work process is increased and the process becomes complicated and a production cost is increased.

Further, the related art illustrated in Patent Reference 3 does not require an increase in a work process, but cannot necessarily obtain a sufficient improvement in the resultant joining effect. That is, the improvement in the joining effect in this case is limited to an improvement associated with an increase in a joining area by contact between the anisotropic conductive paste and a side surface of the edge part of the flexible substrate, and in the case of targeting the small-size and thin circuit component, the effect of improvement in the sufficient peeling strength cannot be obtained. Thus, the manufacturing method of the electronic component configured by connecting the circuit component to the substrate in the related arts and this electronic component have a problem of being difficult to ensure the peeling strength by the simple method.

Hence, an object of the embodiment of the invention is to provide a manufacturing method of an electronic component capable of ensuring a peeling strength of a circuit component by a simple method in the electronic component configured by connecting the circuit component to a substrate, the electronic component, and a manufacturing apparatus of the electronic component.

According to the embodiments, there is provided a manufacturing method of an electronic component, wherein the electronic component includes a circuit component provided with plural first electrodes in an end, and a substrate provided with plural second electrodes, the plural first electrodes connected to the plural second electrodes on the substrate by press attaching using a press attaching tool, the circuit component includes a first surface provided with the plural first electrodes thereon in the end, and a second surface which is a back surface of the first surface, the end is surrounded by a first edge and two second edges extending from both ends of the first edge in a direction intersecting with the first edge, and the plural first electrodes are arranged along the first edge and are formed within a region sandwiched between the two second edges, the manufacturing method including: pressing a part of the second surface of an inside of the second edge in the end to the substrate by a press attaching surface of the press attaching tool with an adhesive arranged between the circuit component and the substrate; making a part of the adhesive reach the second surface to cover at least a part of the second edge by the pressing; and curing the adhesive between the end and the substrate and the part of the adhesive covering the at least the part of the second edge.

According to the embodiments, there is provided an electronic component including a circuit component including plural first electrodes, a substrate comprising plural second electrodes, and a bond part that bonds the circuit component to the substrate with the plural first electrodes and the plural second electrodes electrically conducted, wherein the circuit component has a first surface and a second surface which is a back surface of the first surface, and the first surface in an end is provided with the plural first electrodes, and the end is surrounded by a first edge and two second edges extending from both ends of the first edge in a direction intersecting with the first edge, and the plural first electrodes are arranged along the first edge and are formed within a region sandwiched between the two second edges, and the bond part has reinforced parts on both ends of the bond part, each of the reinforced parts covering at least a part of the two second edges and a part of the second surface.

According to the embodiments, there is provided a manufacturing apparatus of an electronic component, wherein the electronic component includes a circuit component provided with plural first electrodes in an end, and a substrate provided with plural second electrodes, the plural first electrodes connected to the plural second electrodes on the substrate, the circuit component includes a first surface provided with the plural first electrodes thereon in the end, and a second surface which is a back surface of the first surface, the end is surrounded by a first edge and two second edges extending from both ends of the first edge in a direction intersecting with the first edge, and the plural first electrodes are arranged along the first edge and are formed within a region sandwiched between the two second edges, the manufacturing apparatus including: a stage on which the substrate is placed, a thermal press attaching tool comprising a press attaching surface for pressing a part of the second surface of an inside of the second edge in the end, and a pressurization mechanism that attaches the circuit component to the substrate by thermal press attaching by relatively moving the thermal press attaching tool toward the stage with a thermosetting adhesive arranged between the circuit component and the substrate, wherein the thermal press attaching tool has an overhang part that covers the second edge from an upward side in the thermal press attaching.

The embodiments of the invention can ensure a peeling strength of the circuit component by a simple method in the electronic component configured by connecting the circuit component to the substrate.

DETAILED DESCRIPTION

Next, an embodiment of the invention will be described with reference to the drawings. First, a configuration of an electronic component in the present embodiment will be described with reference to FIGS. 1A to 3. In addition, FIG. 3 illustrates a cross section taken on line III-III in FIG. 2C.

Figure 1A:
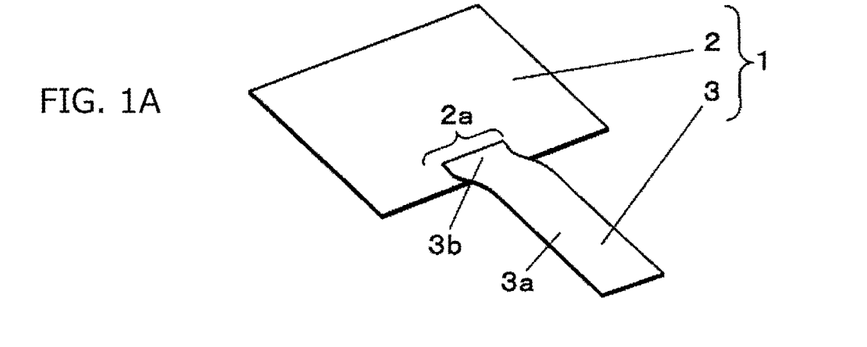
FIGS. 1A and 1B are perspective views illustrating configurations of electronic components of an embodiment of the invention.
Figure 1B:
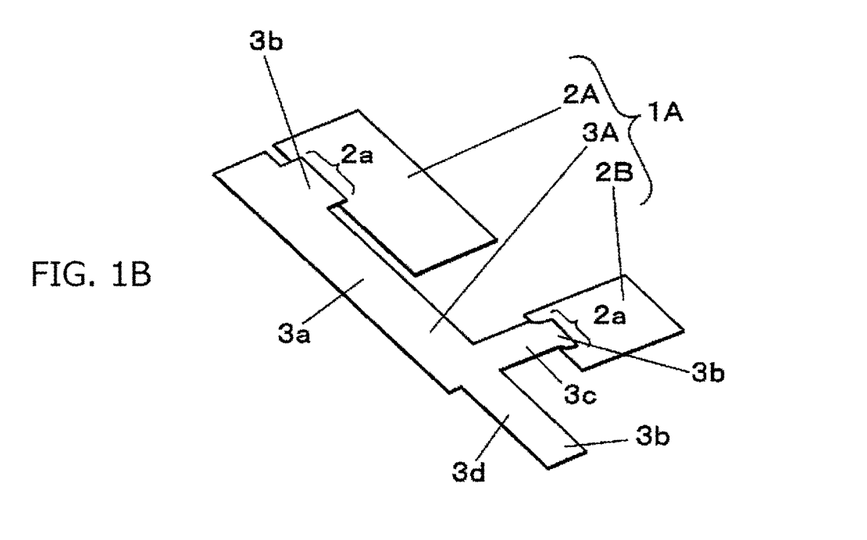

FIGS. 1A and 1B illustrate two forms of the electronic component in the embodiment. FIG. 1A illustrates an electronic component 1 configured by connecting only one circuit component 3 to a substrate 2, and is herein constructed so that an end 3b of a body part 3a constructing the circuit component 3 is bonded to a connection site 2a of the substrate 2. Also, an electronic component 1A illustrated in FIG. 1B illustrates the electronic component 1A configured by connecting plural substrates 2 (substrates 2A, 2B herein) to a circuit component 3A.

The circuit component 3A has plural ends 3b extending from a body part 3a in different directions and forms. That is, the end 3b directly extending from the body part 3a is connected to a connection site 2a of the substrate 2A, and the end 3b extending from the body part 3a through an extension part 3c is connected to a connection site 2a of the substrate 2B. Also, an extension part 3d extending in a longitudinal direction of the body part 3a is provided with the end 3b for connecting the electronic component 1A to another circuit substrate in incorporation into a device.

Figure 2A:
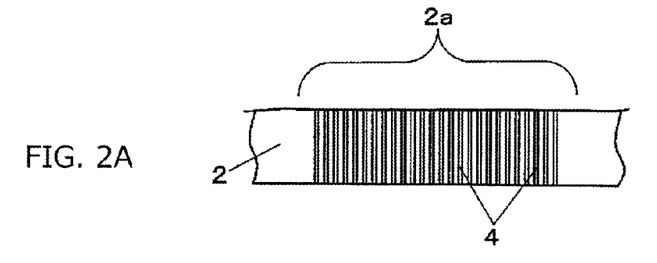
FIGS. 2A to 2C are configuration explanatory diagrams of connection between a circuit component and a substrate in the electronic component of the embodiment of the invention.
Figure 2B:
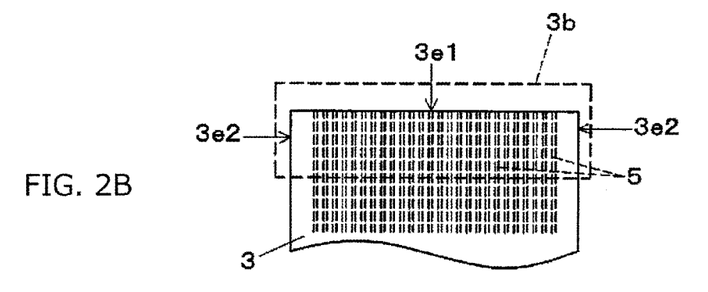
Figure 2C:
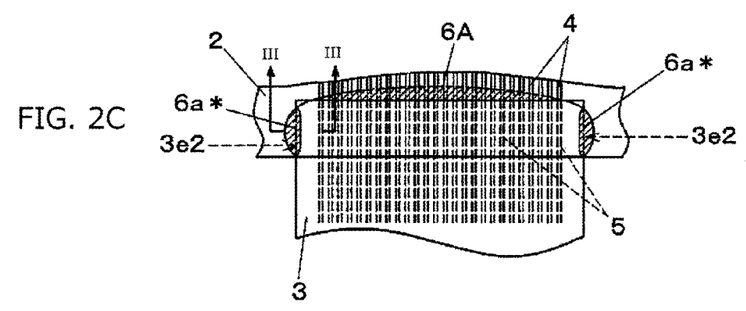
Figure 3:
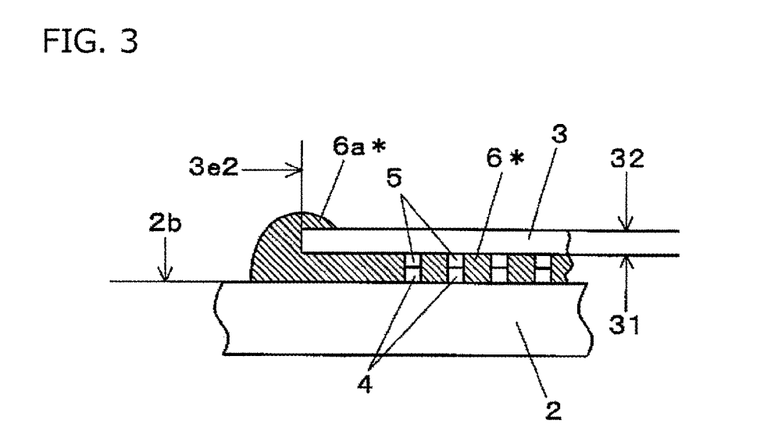
FIG. 3 is a partially cross-sectional view of the connection between the circuit component and the substrate in the electronic component of the embodiment of the invention.

FIGS. 2A to 2C illustrate the details of a connection between the substrate 2 (similarly, substrate 2A, substrate 2B) and the end 3b. FIG. 2A illustrates the connection site 2a formed for connection to the circuit component 3 in an electrode formation surface 2b (see FIG. 3) of the substrate 2 in plan view. The connection site 2a is formed with plural second electrodes 4 in parallel at a predetermined pitch.

FIG. 2B illustrates the end 3b which is a region of a distal end of the circuit component 3 such as a flexible wiring substrate connected to the connection site 2a of the substrate 2 in plan view. The circuit component 3 includes a first surface 31, and a second surface 32 which is a back surface of the first surface 31 (see FIG. 3), and the first surface 31 is formed with plural first electrodes 5.

The end 3b is surrounded by a first edge 3e1 which is a distal end edge of the circuit component 3, and two second edges 3e2 extending from both ends of the first edge 3e1 in a direction (vertical direction in FIG. 3) intersecting with the first edge 3e1. The "edge" in the embodiment is defined as a range including both of a side surface (plane surface in a thickness direction) of the end of the circuit component 3 and ridge lines of intersection between the side surface and the first surface 31, the second surface 32. In addition, when a clear ridge line is not present and an R-shaped curved surface is formed, this curved surface part is also included in the "edge".

In the first surface 31 in the end 3b, the plural first electrodes 5 are arranged along the first edge 3e1 and are formed in parallel at a pitch corresponding to a formation pitch of the second electrodes 4 within a region sandwiched between the two second edges 3e2. That is, the circuit component 3 is configured to have the first surface 31 and the second surface 32 which is the back surface of the first surface 31 and include the plural first electrodes 5 in the first surface 31 in the end 3b of the circuit component 3.

Figure 4:
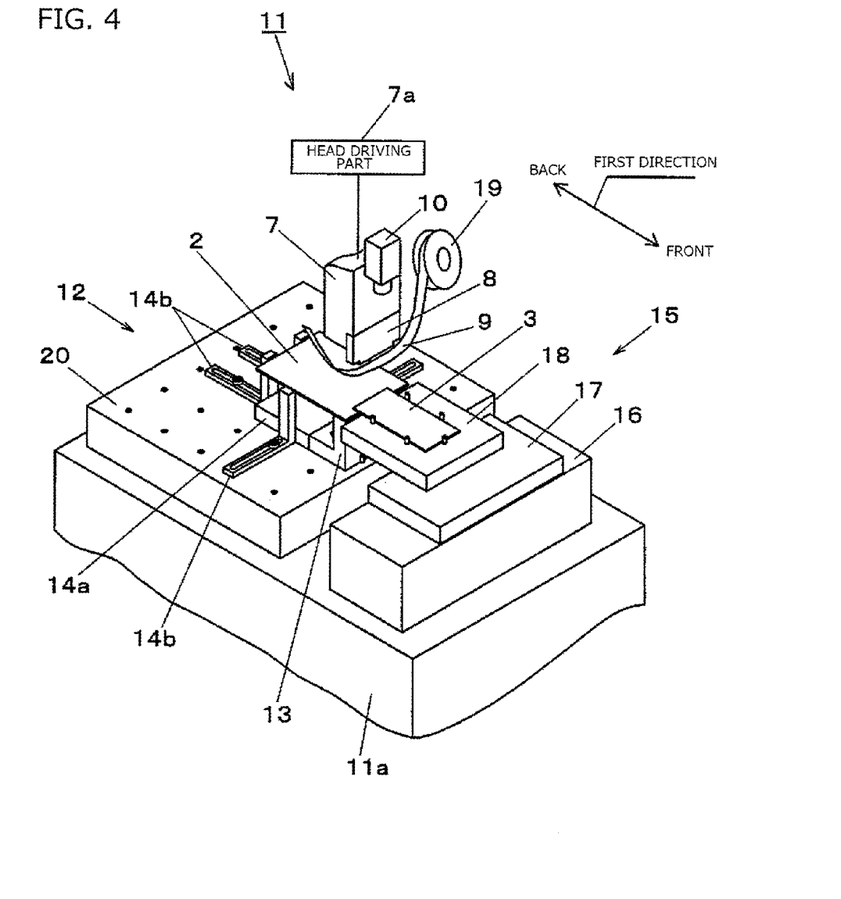
FIG. 4 is a perspective view of a manufacturing apparatus of the electronic component of the embodiment of the invention.

FIG. 2C illustrates a state in which the end 3b of the circuit component 3 is stacked on the connection site 2a of the substrate 2 and the first electrodes 5 of the circuit component 3 are connected to the second electrodes 4 of the substrate 2 using a press attaching tool 8 (see FIG. 4). This connection between the substrate 2 and the circuit component 3 is made by bonding the circuit component 3 to the second electrodes 4 with the plural first electrodes 5 and the plural second electrodes 4 brought into electrical conduction by a bond part 6* interposed between the electrode formation surface 2b of the substrate 2 and the first surface 31 of the circuit component 3 as illustrated in FIG. 3.

That is, the electronic component 1 is configured to include the circuit component 3 having the plural first electrodes 5, the substrate 2 having the plural second electrodes 4, and the bond part 6* in which an adhesive 6 for bonding the circuit component 3 to the substrate 2 is cured with the plural first electrodes 5 and the plural second electrodes 4 brought into electrical conduction. This illustrates an example in which the press attaching tool 8 is a thermal press attaching tool including a heating mechanism and the bond part 6* is formed by thermally curing the adhesive 6 with heating by the press attaching tool 8 using a thermosetting adhesive such as a thermosetting resin as the adhesive 6.

In addition, as the adhesive 6, a material with composition in which the thermosetting adhesive contains conductive particles may be used. As the conductive particles, solder particles or particles of metal such as silver (Ag) can be used. Further, as the adhesive 6, an adhesive such as a photo-curable resin other than the thermosetting resin can be used. In this case, the press attaching tool 8 does not require the heating mechanism.

In a process of thermal press attaching operation by the press attaching tool 8, on the electrode formation surface 2b of the substrate 2, an uncured adhesive 6a extruded from a gap between the substrate 2 and the circuit component 3 is swollen by viscosity, and makes contact with at least a part of the two second edges 3e2 of both sides and creeps up, and further covers a part of the second surface 32 in the vicinity of the second edge 3e2 as illustrated in FIG. 3. Then, by thermally curing the adhesive 6a in this state, the bond part 6* described above is formed in a shape having a reinforced part 6a* for covering at least a part of the two second edges 3e2 and a part of the second surface 32.

Next, a structure of a manufacturing apparatus 11 of the electronic component used for manufacturing the electronic component 1 will be described with reference to FIG. 4. The manufacturing apparatus 11 of the electronic component is an apparatus having a function of mounting the circuit component 3 to the substrate 2 by thermal press attachment and manufacturing the electronic component 1 or the electronic component 1A illustrated in FIG. 1. As illustrated in FIG. 4, the manufacturing apparatus 11 of the electronic component is constructed so that a substrate holding part 12 and a component holding part 15 are arranged on an upper surface of a base 11a in a first direction and a press attaching head 7 including the press attaching tool 8 and a camera 10 is arranged over the substrate holding part 12. Here, the first direction is a direction in which an operator takes the substrate 2 or the circuit component 3 in and out the substrate holding part 12 or the component holding part 15, and the operator side (right front side in FIG. 4) in the first direction is herein defined as the front side.

The press attaching head 7 is driven by a head driving part 7a and thereby, the press attaching tool 8 is upwardly and downwardly moved with respect to the circuit component 3 received by a backup part 13, and the press attaching tool 8 abuts on the second surface 32 of the circuit component 3 to thereby pressurize the circuit component 3 on the substrate 2. A heating mechanism for heating the press attaching tool 8 is built into the head driving part 7a, and when the circuit component 3 is attached to the substrate 2 by thermal pressure, this heating mechanism heats the circuit component 3 through the press attaching tool 8 and this heat is transferred to the adhesive 6 to thereby thermally cure the adhesive 6. In addition, it may be configured to upwardly move the substrate holding part 12 or the component holding part 15 instead of downwardly moving the press attaching head 7. That is, the head driving part 7a and the press attaching head 7 form a pressurization mechanism for attaching the circuit component 3 to the substrate 2 by thermal pressure by relatively moving the press attaching tool 8 toward the substrate holding part 12 with the thermosetting adhesive 6 arranged between the plural first electrodes 5 and the plural second electrodes 4 formed on the substrate 2.

In the embodiment, a press attaching surface 8a formed on the lower end of the press attaching tool 8 is formed in a shape in which the second surface 32 of the inside of the second edge 3e2 in the end 3b is pressed. Further, the press attaching tool 8 is formed in a shape having an overhang part 8b (see FIGS. 6A to 7E) for covering the second edge 3e2 from an upward side at the time of thermal press attachment. By having such a shape, both ends of the press attaching surface 8a press the second surface 32 between the inside of the second edge 3e2 and the outside of the first electrode 5 nearest to the second edge 3e2 in the end 3b in thermal press attaching operation (see FIG. 6B).

Under the press attaching tool 8, a sheet 9 wound and held by a sheet holding part 19 is arranged so as to be able to be fed in a longitudinal direction (direction orthogonal to the first direction) of the press attaching tool 8. The sheet 9 is interposed between the press attaching surface 8a of the press attaching tool 8 and the second surface 32 of the circuit component 3 at the time of press attachment of the circuit component 3 by the press attaching tool 8 (see FIGS. 5A to 5C), and the press attaching tool 8 is prevented from being soiled with adhesion of the adhesive 6 protruding at the time of thermal press attaching operation. That is, the manufacturing apparatus 11 of the electronic component is configured to include the sheet holding part 19 for winding and holding the sheet 9 and interpose the sheet 9 held by the sheet holding part 19 between the press attaching tool 8 and the circuit component 3 at the time of thermal press attachment.

The substrate holding part 12 in the manufacturing apparatus 11 of the electronic component is a stage on which the substrate 2 is placed, and has a function of holding a position of the substrate 2 while receiving the connection site 2a (FIG. 2A) targeted for press attachment in the substrate 2 from the lower surface side. In the embodiment, the substrate holding part 12 is constructed by combining the backup part 13, a substrate support part 14a and plural substrate guide parts 14b. The backup part 13 has a function of heating for thermal press attachment while receiving the connection site 2a of the substrate 2. The component holding part 15 is constructed so that a component stage 18 on which the circuit component 3 is placed in a predetermined position is held in a movement base 17 moved by a component stage movement mechanism 16.

In mounting work of mounting the circuit component 3 to the substrate 2, the end 3*b* of the circuit component 3 is stacked on the connection site 2*a*, which is formed on the edge of the substrate 2 and is received and heated by the backup part 13, through the adhesive 6. Then, in this state, the head driving part 7*a* is driven and the press attaching head 7 is downwardly moved, and the press attaching tool 8 presses and heats the circuit component 3 on the substrate 2. When the press attaching tool 8 is aligned with the connection site 2*a*, positional deviations of the circuit component 3 from the substrate 2 and the press attaching head 7 are corrected based on a position recognition result recognized by imaging of the connection site 2*a* by the camera 10.

Figure 5A:
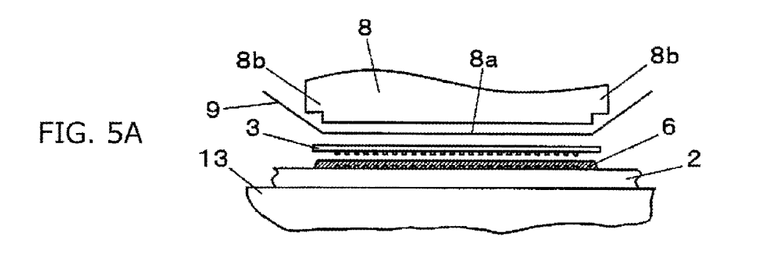
FIGS. 5A to 5C are process explanatory diagrams of a manufacturing method of the electronic component of the embodiment (Example 1) of the invention.

Next, a method of manufacturing the electronic component 1 by the manufacturing apparatus 11 of the electronic component will be described with reference to FIGS. 5A to 6C. In addition, FIG. 6 illustrates a partial cross section of the end 3*b* of the circuit component 3 in a process of attaching the circuit component 3 to the substrate 2 by thermal pressure. FIG. 5A illustrates a state in which the substrate 2 with the adhesive 6 made of a thermosetting resin supplied to the connection site 2*a* (see FIG. 2A) is supported by the backup part 13 of the substrate holding part 12. Here, the end 3*b* of the circuit component 3 is aligned with the substrate 2 in a state in which the adhesive 6 is previously arranged between the plural first electrodes 5 and the plural second electrodes 4 of the substrate 2. The sheet 9 is interposed between the circuit component 3 and the press attaching surface 8*a* of the press attaching tool 8, and the overhang part 8*b* is positioned over the second edge 3*e*2 of the circuit component 3 as illustrated in FIG. 6A.

Figure 5B:
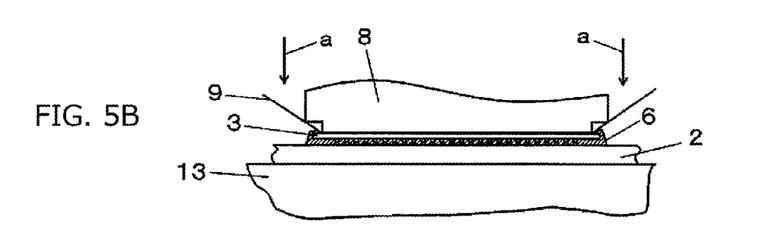
Figure 6A:
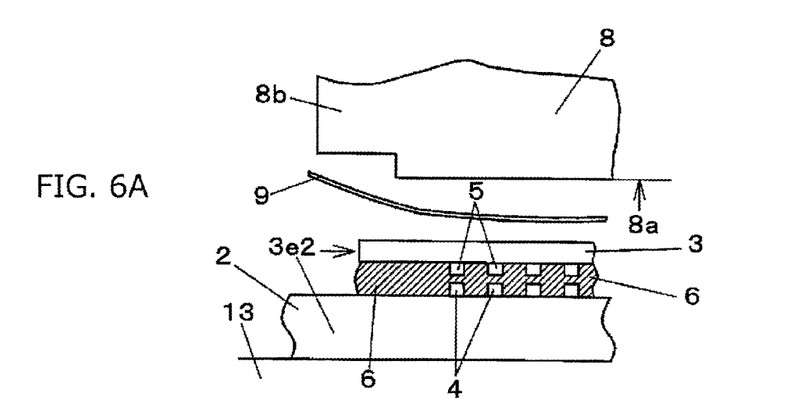
FIGS. 6A to 6C are process explanatory diagrams of the manufacturing method of the electronic component of the embodiment (Example 1) of the invention.
Figure 6B:
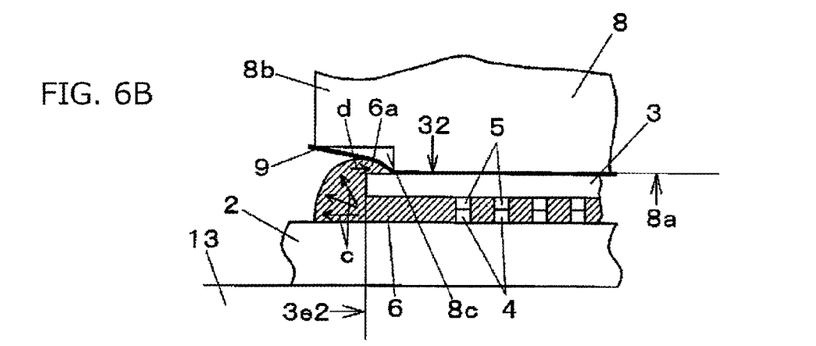
Figure 6C:
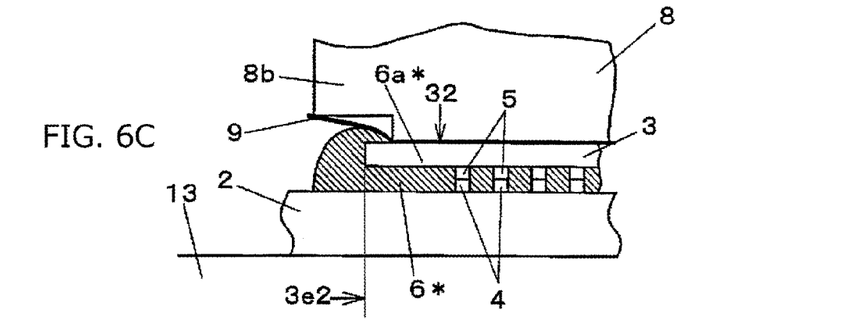

Then, the head driving part 7*a* is driven, and the press attaching head 7 with the press attaching tool 8 previously heated to a predetermined temperature by the heating mechanism is downwardly moved and thereby, the press attaching tool 8 is downwardly moved (arrow a) and the press attaching surface 8*a* presses the circuit component 3 on the substrate 2 through the sheet 9 as illustrated in FIG. 5B. That is, the press attaching surface 8*a* of the press attaching tool 8 press-attaches the second surface 32 of the inside of the second edge 3*e*2 in the end 3*b* of the circuit component 3 to the substrate 2. Accordingly, the circuit component 3 is moved toward the substrate 2, and the first electrodes 5 make contact with the second electrodes 4 to make electrical connection as illustrated in FIG. 6B. That is, using the press attaching tool 8, the plural first electrodes 5 are connected to the plural second electrodes 4 formed on the substrate 2. In this thermal press attaching operation, press attachment is performed with the sheet 9 interposed between the press attaching tool 8 and the circuit component 3. Accordingly, the press attaching tool 8 can be prevented from being soiled with adhesion of the adhesive 6 to the press attaching tool 8.

By downwardly moving the circuit component 3 with respect to the substrate 2 in this press attaching operation, the adhesive 6 is extruded from a gap between the substrate 2 and the circuit component 3 to the outside of the second edge 3*e*2 (see arrows c) to form a shape swollen upwardly higher than the second surface 32 of the circuit component 3. At this time, a gap part 8*c* is present between a lower surface of the overhang part 8*b* and the second surface 32 of the end 3*b* of the circuit component 3 with the press attaching surface 8*a* abutting on the circuit component 3 since the press attaching tool 8 has a shape having the overhang part 8*b* for covering an upward side of the second edge 3*e*2. As a result, the swollen adhesive 6 extruded to the outside of the second edge 3*e*2 is guided by the sheet 9 and is moved to the inside of the gap part 8*c* on the second surface 32 (see arrow d).

In the thermal press attaching process, a temperature of the adhesive 6 is increased by heating from the backup part 13 through the substrate 2 and heating through the press attaching tool 8 and the circuit component 3. In this temperature increase process, a phenomenon in which viscosity of the adhesive 6 is once decreased occurs. Then, this decrease in viscosity accelerates wettability action in which the adhesive 6 is moved along a solid surface. By such movement of the adhesive 6, the adhesive 6*a* in which the adhesive 6 is moved to the second surface 32 is formed on at least a part of the end 3*b* of the circuit component 3. That is, in the embodiment, press attachment by the press attaching tool 8 makes a part of the adhesive 6 reach the second surface 32 to obtain a state in which at least a part of the second edge 3*e*2 is covered.

Then, by continuing heating by the heating mechanism of the head driving part 7*a* for a predetermined time in this state, the adhesive 6 between the end 3*b* of the circuit component 3 and the substrate 2 and the adhesive 6*a* for covering at least a part of the second edge 3*e*2 are cured using heat transferred from the backup part 13 and the press attaching tool 8. Subsequently, the predetermined time has elapsed and thereby, the adhesive 6 between the circuit component 3 and the substrate 2 is thermally cured, and the bond part 6* for bonding the circuit component 3 to the substrate 2 with the plural first electrodes 5 and the plural second electrodes 4 brought into electrical conduction is formed. With this, the adhesive 6*a* for covering at least a part of the second edge 3*e*2 is thermally cured to thereby form the reinforced part 6*a** for locking the second edge 3*e*2 of the end 3*b* of the circuit component 3 from the upper surface side and reinforcing a peeling strength.

That is, in the embodiment, the adhesive 6 is the thermosetting adhesive, and the adhesive 6 between the end 3*b* and the substrate 2 and the adhesive 6*a* for covering the second edge 3*e*2 are thermally cured using heat from the press attaching tool 8. Further, the press attaching tool 8 is provided with the overhang part 8*b* overhung to an upward side of the adhesive 6*a* for covering the second edge 3*e*2, and the adhesive 6*a* for covering the second edge 3*e*2 is cured using heat from the overhang part 8*b*. By heating using such a method, thermal curing time for forming the reinforced part 6*a** for covering the second edge 3*e*2 can be reduced together with an equipment advantage that a thermal press attaching head used in a conventional apparatus can be used as it is.

Figure 5C:
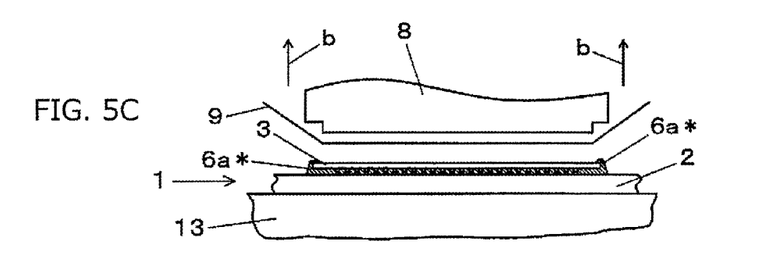

Subsequently, the head driving part 7*a* is driven, and the press attaching head 7 is upwardly moved and thereby, the press attaching tool 8 is upwardly moved (arrow b) together with the sheet 9 as illustrated in FIG. 5C, and the press attaching tool 8 is separated from the circuit component 3 and the substrate 2 on the backup part 13 and accordingly, the electronic component 1 with the above configuration is completed. In addition, after the press attaching tool 8 is separated from the end 3*b*, the adhesive 6*a* for covering the second edge 3*e*2 may be heated to accelerate thermal curing of the adhesive by other heating means such as an infrared heater. By dividing a heating process in this manner, individual heating time can be reduced to improve productivity.

The electronic component 1 formed by each of the processes described above is configured to lock and reinforce the second edge 3*e*2 by the reinforced part 6*a** in the connection in which the end 3*b* of the circuit component 3 is connected to the substrate 2 by the adhesive 6. Accordingly, peeling resistance is ensured by the reinforced part 6a* even when an external force by which the end 3b of the circuit component 3 is peeled from the substrate 2 acts. That is, the manufacturing method of the electronic component illustrated in the embodiment can improve a peeling strength of the circuit component 3 by a simple process without requiring additional processing for reinforcement.

In addition, a shape example of the overhang part 8b formed on the press attaching tool 8 in the embodiment can include different variations as illustrated in FIGS. 7A to 7E. As described above, the overhang part 8b is set in the shape in which the adhesive 6 protruding from the gap between the circuit component 3 and the substrate 2 in thermal press attaching operation can be moved to the second surface 32 of the end 3b so as to cover the second edge 3e2 and the adhesive 6 can be cured using heat from the overhang part 8b. The shape is set based on, for example, trial results of performing actual press attachment using the press attaching tool 8 having the overhang parts 8b with various shapes on the adhesive 6 of a target, and the following dimensions of each of the parts are determined properly.

Overhang parts 8b1 to 8b5 illustrated in FIGS. 7A to 7E exemplify such variations. In each of the examples illustrated herein, a size of the press attaching surface 8a is set so that both side ends of the press attaching surface 8a for pressing the circuit component 3 in the press attaching tool 8 are positioned in a range (distance d3) between the second edges 3e2 and the first electrodes 5 positioned in the outermost end in the end 3b of the circuit component 3 (see FIG. 7F). And, each shape of the outside of the press attaching surface 8a is set as described below.

Figure 7A:
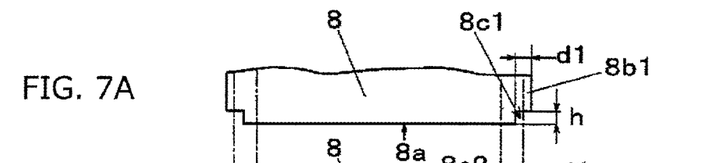
FIGS. 7A to 7F are shape explanatory diagrams of press attaching tools used in the manufacturing apparatus of the electronic component of the embodiment of the invention.
Figures 7B, 7C:
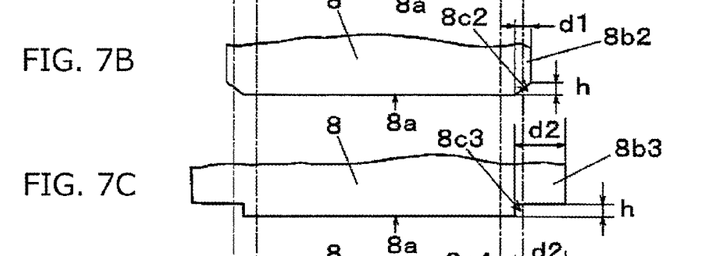

First, the overhang part 8b1 illustrated in FIG. 7A exemplifies a gap part 8c1 formed with the press attaching surface 8a abutting on the circuit component 3 forms a rectangular shape with a width d1 and a height h. The overhang part 8b2 illustrated in FIG. 7B exemplifies a gap part 8c2 formed in a triangular shape with a width d1 of a base and a height h. Also, the overhang part 8b3 illustrated in FIG. 7C exemplifies a gap part 8c3 formed in a rectangular shape with a width dimension d2 larger than d1 and a height h.

Figures 7D, 7E, 7F:
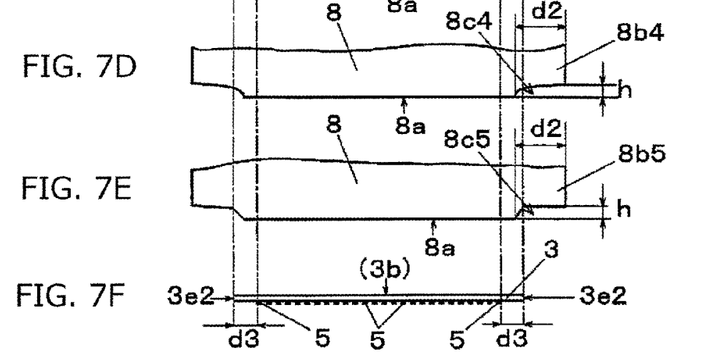

Also, the overhang part 8b4 illustrated in FIG. 7D exemplifies a gap part 8c4 having a shape with a width dimension d2 larger than d1 and a height h and a range included in the distance d3 in the circuit component 3 is formed in an R shape. Further, the overhang part 8b5 illustrated in FIG. 7E exemplifies a gap part 8c5 having a shape with a width dimension d2 larger than d1 and a height h and a range included in the distance d3 in the circuit component 3 is formed in a slope shape.

Figure 8A:
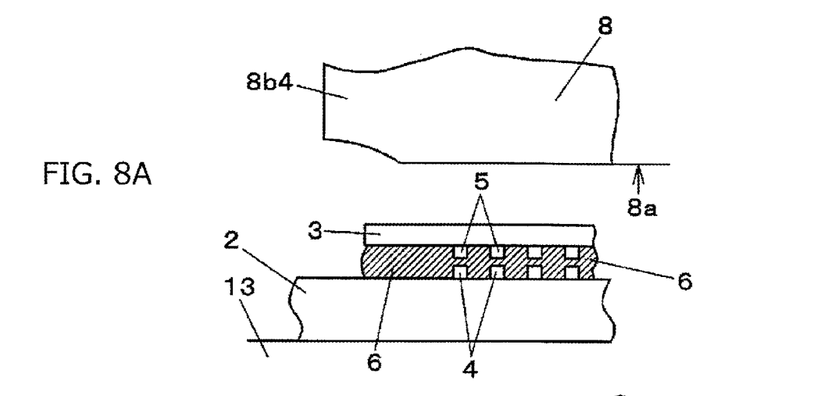
FIGS. 8A to 8C are process explanatory diagrams of a manufacturing method of the electronic component of the embodiment (Example 2) of the invention.
Figure 8B:
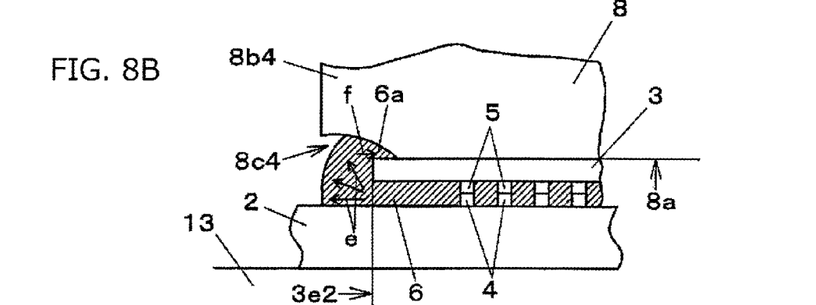
Figure 8C:
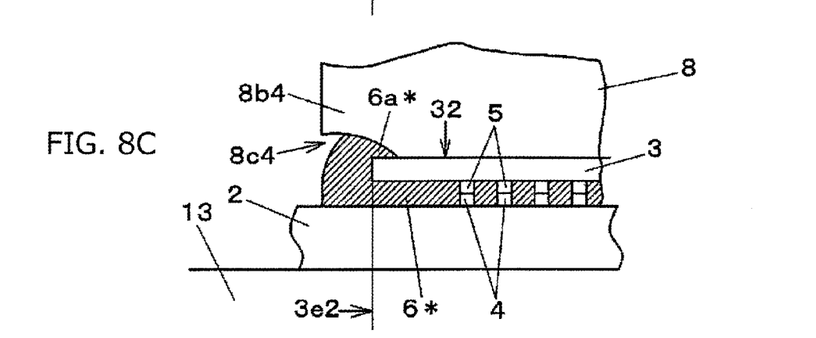

In addition, the example (Example 1) illustrated in FIGS. 5A to 6C illustrates the example in which thermal press attachment is performed with the sheet 9 interposed between the press attaching tool 8 and the circuit component 3, but thermal press attachment may be performed without the sheet 9 like an example (Example 2) illustrated in FIGS. 8A to 8C. In addition, FIGS. 8A to 8C illustrate a partial cross section of the end 3b of the circuit component 3 in a process of attaching the circuit component 3 to the substrate 2 by thermal pressure like FIGS. 6A to 6C. FIG. 8A first illustrates a state similar to that of FIG. 5A, and differs from the example illustrated in FIG. 5A in that the sheet 9 is not interposed between the circuit component 3 and the press attaching surface 8a of the press attaching tool 8 and the overhang part 8b4 illustrated in FIG. 7D is formed on the press attaching tool 8, and the overhang part 8b4 is positioned over the second edge 3e2 of the circuit component 3.

Then, the head driving part 7a is driven, and the press attaching head 7 with the press attaching tool 8 previously heated to a predetermined temperature by the heating mechanism is downwardly moved and thereby, the press attaching surface 8a presses the circuit component 3 on the substrate 2 as illustrated in FIG. 8B. That is, the press attaching surface 8a of the press attaching tool 8 press-attaches the second surface 32 of the inside of the second edge 3e2 in the end 3b of the circuit component 3 to the substrate 2. Accordingly, the circuit component 3 is moved toward the substrate 2, and the first electrodes 5 abut on the second electrodes 4 to make electrical connection.

By downwardly moving the circuit component 3 with respect to the substrate 2 in this press attaching operation, the adhesive 6 is extruded from a gap between the substrate 2 and the circuit component 3 to the outside of the second edge 3e2 (see arrows e) to form a shape swollen upwardly higher than the second surface 32 of the circuit component 3. At this time, the gap part 8c4 is formed between a lower surface of the overhang part 8b4 and the second surface 32 of the end 3b of the circuit component 3 with the press attaching surface 8a abutting on the circuit component 3 since the press attaching tool 8 has a shape having the overhang part 8b4 for covering an upward side of the second edge 3e2. As a result, the swollen adhesive 6 extruded to the outside of the second edge 3e2 is guided by the lower surface of the overhang part 8b4 and is moved to the inside of the gap part 8c4 on the second surface 32 (see arrow f).

That is, in Example 2, the overhang part 8b4 makes direct contact with the adhesive 6 protruding from the gap between the end 3b and the substrate 2 to the outside of the second edge 3e2 in press attachment from an upward side without interposing the sheet 9. Movement of this adhesive 6 is accelerated by wettability action in which the adhesive 6 is moved along a solid surface by a decrease in viscosity in a temperature increase process of the adhesive 6 like Example 1 illustrated in FIGS. 5A to 5C. Then, by continuing heating by the heating mechanism of the head driving part 7a for a predetermined time in this state, the bond part 6* for bonding the circuit component 3 to the substrate 2 with the plural first electrodes 5 and the plural second electrodes 4 brought into electrical conduction is formed like Example 1. With this, the adhesive 6a for covering at least a part of the second edge 3e2 is thermally cured using heat from the overhang part 8b4 to thereby form the reinforced part 6a* for locking the second edge 3e2 of the end 3b of the circuit component 3 from the upper surface side and reinforcing a peeling strength.

As described above, the electronic component illustrated in the embodiment is constructed so that in the electronic component 1 configured to include the bond part 6* for bonding the circuit component 3 to the substrate 2 with the second electrodes 4 of the substrate 2 and the first electrodes 5 arranged along the first edge 3e1 in the end 3b surrounded by the first edge 3e1 and the two second edges 3e2 extending from both ends of the first edge 3e1 in the direction of intersection in the circuit component 3 brought into electrical conduction, the reinforced parts 6a* for covering at least a part of the two second edges 3e2 and a part of the upper surface (second surface 32) of the circuit component 3 by protruding the adhesive 6 constructing the bond part 6* from the gap between the substrate 2 and the circuit component 3 in both ends of the connection are formed.

Also, in the manufacturing method of manufacturing the electronic component 1 with the above configuration, the press attaching surface 8a of the press attaching tool 8 press-attaches the second surface 32 of the inside of the second edge 3e2 in the end 3b to the substrate 2 with the adhesive 6 arranged between the plural first electrodes 5 and the plural second electrodes 4 of the substrate 2, and the press attachment makes a part of the adhesive 6 reach the second surface 32 to obtain a state in which at least a part of the second edge 3e2 is covered, and the adhesive 6 between the end 3b and the substrate 2 and the adhesive 6a for covering at least a part of the second edge 3e2 are cured. Accordingly, a peeling strength of the circuit component 3 can be ensured by a simple method in the electronic component 1 with the above configuration.

Further, the manufacturing apparatus 11 for manufacturing the electronic component 1 with the above configuration is configured to include the stage on which the substrate 2 is placed, the press attaching tool 8 of a thermal press attaching type including the press attaching surface 8a for pressing the second surface 32 of the inside of the second edge 3e2 in the end 3b of the circuit component 3, and the pressurization mechanism for attaching the circuit component 3 to the substrate 2 by thermal pressure by relatively moving the press attaching tool 8 toward the stage with the thermosetting adhesive 6 arranged between the plural first electrodes 5 and the plural second electrodes 4 formed on the substrate 2, and the press attaching tool 8 is configured to have the overhang part 8b for covering the second edge 3e2 from the upward side at the time of the thermal press attachment. Accordingly, the thermosetting adhesive 6a which covers the second edge 3e2 and reaches the second surface 32 can be cured speedily, and the peeling strength of the circuit component 3 can be ensured at low cost by simple equipment.

A manufacturing method of an electronic component and the electronic component of the invention have an effect capable of ensuring a peeling strength by a simple method in the electronic component configured by connecting a circuit component to a substrate, and are useful in the field of manufacturing the electronic component configured by connecting the circuit component such as a flexible wiring substrate to the substrate.

A manufacturing apparatus of an electronic component of the invention has an effect capable of ensuring a peeling strength of a circuit component at low cost by simple equipment in manufacture of the electronic component configured by connecting the circuit component to a substrate, and is useful in the field of manufacturing the electronic component configured by connecting the circuit component such as a flexible wiring substrate to the substrate.

What is claimed is:

1. A manufacturing method of an electronic component, wherein
the electronic component includes a circuit component provided with plural first electrodes in an end, and a substrate provided with plural second electrodes, the plural first electrodes connected to the plural second electrodes on the substrate by press attaching using a press attaching tool,
the circuit component includes a first surface provided with the plural first electrodes thereon in the end, and a second surface which is an upper surface of the circuit component and a back surface of the first surface,
the end is surrounded by a first edge and two second edges extending from both ends of the first edge in a direction intersecting with the first edge, and
the plural first electrodes are arranged along the first edge and are formed within a region sandwiched between the two second edges,
the manufacturing method comprising:
pressing the second surface inside of the second edges in the end to the substrate by a press attaching surface of the press attaching tool with an adhesive arranged between the circuit component and the substrate;
making a part of the adhesive reach the second surface to cover at least a part of the second edges and at least a part of the second surface by the pressing; and
curing the adhesive between the end and the substrate and the part of the adhesive covering at least the part of the second edges and the at least the part of the second surface,
wherein at least a portion of the press attaching tool is downwardly recessed to form an overhang part overhung to an upward side of the part of the adhesive covering the part of the second edges and the part of the second surface, wherein the press attaching is performed with a sheet interposed between the press attaching tool and the circuit component, and wherein in the making, a gap is present between a lower surface of the overhang part and the sheet.

2. The manufacturing method of the electronic component according to claim 1, wherein the adhesive is a thermosetting adhesive, and the adhesive between the end and the substrate and the part of the adhesive covering the part of the second edges and the part of the second surface are thermally cured using heat from the press attaching tool.

3. The manufacturing method of the electronic component according to claim 1, wherein the part of the adhesive covering the part of the second edges and the part of the second surface is cured using heat from the overhang part.

4. The manufacturing method of the electronic component according to claim 1, wherein, in the press attaching, the sheet makes contact with a part of the adhesive protruding from between the end and the substrate to an outside of the second edges from the upward side.

5. The manufacturing method of the electronic component according to claim 2, wherein after the press attaching tool is separated from the end, the part of the adhesive covering the part of the second edges and the part of the second surface is heated to accelerate thermal curing of the part of the adhesive.

6. The manufacturing method of the electronic component according to claim 1, wherein in the making, at least the part of the second surface is covered with a part of the adhesive protruding from between the end and the substrate to an outside of the second edges.

7. The manufacturing method of the electronic component according to claim 1, wherein the part of the adhesive covering the part of the second edges and the part of the second surface is cured using heat from the overhang part.

* * * * *